US012757623B2

(12) United States Patent
Nakamaru et al.

(10) Patent No.: US 12,757,623 B2
(45) Date of Patent: Oct. 6, 2026

(54) TEXTILE AND TEXTILE-TYPE DEVICE

(71) Applicant: ZOZO, Inc., Chiba (JP)

(72) Inventors: Satoshi Nakamaru, Chiba (JP); Kotaro Tajima, Chiba (JP)

(73) Assignee: ZOZO, Inc., Chiba (JP)

( * ) Notice: Subject to any disclaimer, the term of this patent is extended or adjusted under 35 U.S.C. 154(b) by 331 days.

(21) Appl. No.: 18/704,499

(22) PCT Filed: Nov. 2, 2021

(86) PCT No.: PCT/JP2021/040334

§ 371 (c)(1),
(2) Date: Apr. 25, 2024

(87) PCT Pub. No.: WO2023/079586

PCT Pub. Date: May 11, 2023

(65) Prior Publication Data

US 2025/0234766 A1 Jul. 17, 2025

(51) Int. Cl.
*H10K 77/10* (2023.01)
*H10K 59/82* (2023.01)
*H10K 102/00* (2023.01)

(52) U.S. Cl.
CPC ........... *H10K 77/111* (2023.02); *H10K 59/82* (2023.02); *H10K 2102/311* (2023.02)

(58) Field of Classification Search
CPC ................. H10K 77/111; H10K 59/82; H10K 2102/311; H05B 33/02; H05B 33/04; H05B 33/06; H05B 33/12; H05B 33/14
See application file for complete search history.

(56) References Cited

U.S. PATENT DOCUMENTS 6,229,259 B1 * 5/2001 Christensen, Sr. .. H10K 50/182 313/506
8,384,209 B2 * 2/2013 Oikawa ................. H10W 29/00 257/702
8,552,418 B2 * 10/2013 Sugiyama .......... H10D 86/0214 257/679
8,563,397 B2 * 10/2013 Chida .................. H10W 90/00 438/455

(Continued)

FOREIGN PATENT DOCUMENTS

JP 2002-258775 A 9/2002
JP 2005-524783 A 8/2005

(Continued)

OTHER PUBLICATIONS

Office Action issued in the corresponding Japanese Application No. 2023-557855 dated Sep. 24, 2024 w/ English Translation.

(Continued)

*Primary Examiner* — Victor A Mandala
(74) *Attorney, Agent, or Firm* — Rimon P.C.

(57) ABSTRACT

To appropriately provide a textile that has a display function. A textile (100) includes warp and weft that are woven, where the weft is covered by a light emitting layer, electrode layers that sandwich the light emitting layer, and a protective layer that sandwiches the electrode layers, the weft includes an exposed region in which a part of the protective layer is removed, and the warp is conductive warp that is arranged so as to come into contact with the exposed region.

8 Claims, 6 Drawing Sheets

(56) References Cited

U.S. PATENT DOCUMENTS

| | | | | |
|---|---|---|---|---|
| 10,121,832 | B1 * | 11/2018 | Wu | G06F 3/0412 |
| 11,690,253 | B2 * | 6/2023 | Huang | H10K 59/879<br>257/40 |
| 12,256,812 | B1 * | 3/2025 | Crews | A44C 5/0053 |
| 2003/0006693 | A1 * | 1/2003 | Topelberg | H05B 33/12<br>313/483 |
| 2004/0009729 | A1 * | 1/2004 | Hill | D03D 11/00<br>442/181 |
| 2004/0125515 | A1 * | 7/2004 | Popovich | D03D 1/0088<br>361/1 |
| 2005/0018424 | A1 * | 1/2005 | Popovich | D03D 1/0088<br>362/247 |
| 2010/0208445 | A1 * | 8/2010 | Asvadi | H05K 1/189<br>442/206 |
| 2011/0175630 | A1 * | 7/2011 | Bhattacharya | H05K 1/189<br>361/329 |
| 2014/0191211 | A1 * | 7/2014 | Chabrecek | D03D 1/0088<br>257/431 |
| 2014/0329048 | A1 * | 11/2014 | Jung | H10K 50/844<br>428/221 |
| 2016/0359452 | A1 * | 12/2016 | Parent | H10K 77/111 |
| 2018/0153033 | A1 * | 5/2018 | Sugita | D03D 1/0082 |
| 2020/0075873 | A1 * | 3/2020 | Jing | H05K 1/038 |
| 2020/0149217 | A1 * | 5/2020 | Choi | D06N 3/00 |
| 2021/0197517 | A1 * | 7/2021 | Kim | C08G 61/126 |
| 2021/0200268 | A1 * | 7/2021 | Lee | G06F 1/1652 |
| 2021/0210715 | A1 * | 7/2021 | Soh | G09F 9/301 |
| 2022/0113824 | A1 * | 4/2022 | Kishimoto | H05K 7/20963 |
| 2022/0181592 | A1 * | 6/2022 | Jeong | G09F 9/301 |
| 2022/0246596 | A1 * | 8/2022 | Yamazaki | H10K 59/1213 |
| 2022/0336767 | A1 * | 10/2022 | Kim | G03B 21/60 |

FOREIGN PATENT DOCUMENTS

| | | |
|---|---|---|
| JP | 2017-208275 A | 11/2017 |
| JP | 2020-088060 A | 6/2020 |

OTHER PUBLICATIONS

International Search Report issued in the corresponding International Application No. PCT/JP2021/040334 dated Jan. 25, 2022, w/ English Translation.

* cited by examiner

TEXTILE AND TEXTILE-TYPE DEVICE

CROSS-REFERENCE TO RELATED APPLICATIONS

This application is the U.S. National Phase under 35 U.S.C. § 371 of International Application No. PCT/JP2021/040334, filed on Nov. 2, 2021, and the entire contents of each of which are hereby incorporated by reference.

FIELD

The present invention relates to a textile and a textile-type device.

BACKGROUND

In various industries, such as interior (for example, wall paper), fashion (for example, clothes), and automotive, there is a demand for incorporating an electronic circuit into a fabric or a product that is made of a fabric. To respond to the demand as described above, a technology using a textile called a smart textile is known (Patent Literature 1 below).

Further, as a light-emitting element that is applicable to a thin, soft, and flexible device (flexible device), an organic electroluminescent element (organic EL element) is known. For example, a technology for using an organic EL element in a display apparatus or a lighting apparatus is known (Patent Literature 2 below).

CITATION LIST

Patent Literature

Patent Literature 1: Japanese Unexamined Patent Application Publication No. 2017-208275
Patent Literature 2: Japanese Unexamined Patent Application Publication No. 2020-088060

SUMMARY

Technical Problem

However, in the conventional technologies, it is difficult to appropriately provide a textile that has a display function.

The present invention has been conceived in view of the foregoing circumstances, and an object of the present invention is to appropriately provide a textile that has a display function.

Solution to Problem

A textile according to the present disclosure includes: warp; and weft, wherein the warp and the weft are woven, the weft is covered by a light emitting layer, electrode layers that sandwich the light emitting layer, and a protective layer that sandwiches the electrode layers, the weft includes an exposed region in which a part of the protective layer is removed, and the warp is conductive warp that is arranged so as to come into contact with the exposed region.

Advantageous Effects of Invention

According to one aspect of embodiments, it is possible to appropriately provide a textile that has a display function.

DESCRIPTION OF EMBODIMENTS

Mode (hereinafter, referred to as "embodiments") for implementing a textile and a textile-type device according to the present disclosure will be described in detail below with reference to the drawings. Meanwhile, the textile and the textile-type device according to the present disclosure is not limited by the embodiments below. Further, in each of the embodiments below, the same components are denoted by the same reference symbols, and repeated explanation will be omitted.

EMBODIMENT

1. Example of Information Processing

A textile that has an indicator function that allows control of an electrical current is expected to be applied to a product, such as a wearable device. In particular, a textile that is made of a soft material as the material itself may be applied to a curved surface or may be implemented as a deformable product, such as clothes, and therefore has an advantage of being widely applicable.

In recent years, a flexible display or the like using an organic EL element has been used. However, because of a complicated signal line, a display may be integrated as a single sheet. Therefore, when the display is applied to a textile, it is common to adopt a method of pasting a film of an organic EL element or a method of covering by a sleeve of an organic EL element; however, in this case, it may be difficult to ensure breathability that the textile originally has. In addition, if a thickness is increased due to pasting, flexibility may be degraded.

Furthermore, in a certain realm, such as art or stage production, a textile as a combination of certain elements, such as light emitting diodes (LEDs) has been devised. However, the LEDs are inorganic, and therefore, if a large size is implemented, a large number of LEDs are needed, which leads to increase in costs. Moreover, the LEDs are hard materials, and therefore, for example, if the LEDs are arranged in a divided manner on dots and mounted on clothes or the like, texture may be degraded.

Furthermore, the organic EL element is formed on a substrate that is made of a soft material, and therefore, it is known that the organic EL element is easily affected by oxygen permeation (or water vapor permeation) or the like and quickly deteriorated.

The present invention has been conceived in view of the above circumstances, and an object of the present invention is to appropriately provide a textile that has a display function.

In the embodiments below, a textile 100 is configured such that warp and weft are woven, where a thin organic EL element is woven in the weft and conductive warp (conductive yarn) comes into contact with a part of the weft.

Figure 1:
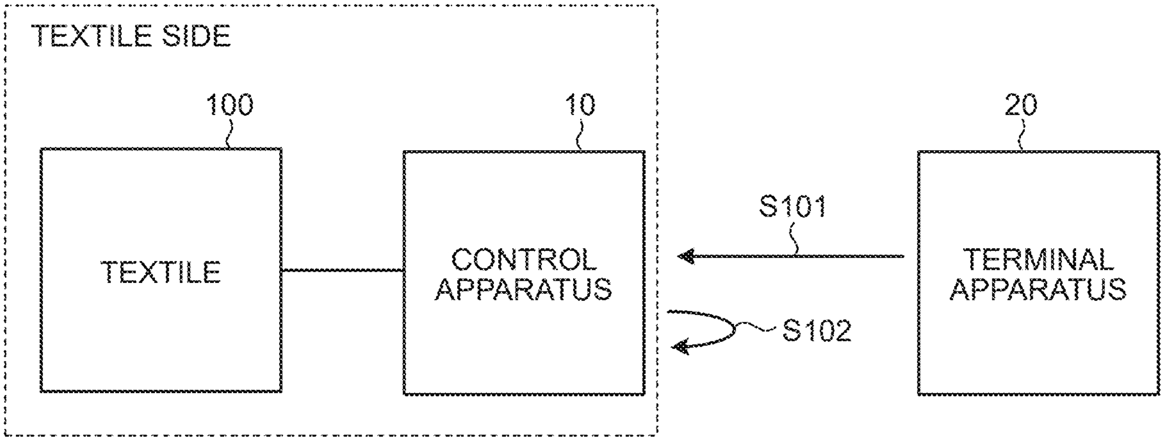
FIG. 1 is a diagram illustrating an example of information processing according to one embodiment.

FIG. 1 is a diagram illustrating an example of information processing according to one embodiment. In FIG. 1, it is assumed that the textile 100 is controlled by a control apparatus 10. For example, an electrical current that flows through the textile 100 is controlled by the control apparatus 10.

Here, an organic EL element has a structure in which a plurality of kinds of layers including a light emitting layer is sandwiched between an anode and a cathode. The organic EL element emits light by causing an organic compound that is included in the light emitting layer to excite by using energy that is generated when a hole (electron hole) that is injected from the anode and an electron that is injected from the cathode are coupled.

Further, the organic EL element is an element that is driven by an electrical current. Therefore, the organic EL element is controlled by the control apparatus 10.

A terminal apparatus 20 transmits control information to the control apparatus 10 in accordance with operation performed by a user who uses the terminal apparatus 20, for example (Step S101). The control apparatus 10 performs a process in accordance with the control information that is transmitted from the terminal apparatus 20 (Step S102). For example, a process for supplying power (applying voltage) and causing an electrical current to flow is performed.

A configuration of the textile 100 will be described in detail below.

The textile 100 is a textile that has a display structure of an organic EL element that is woven by patterning a film foil of the organic EL element.

As one example of the display structure, a structure of a general organic EL element called conventional Organic Light-emitting Diodes (COLED) is known. The COLED has a structure in which a film is formed on a certain film to soften a material, so that oxygen permeation may be more likely to occur. Meanwhile, it is known that, to prevent oxygen permeation, barrier property of about $10^{-6}$ g/m$^2$/day or more is needed. Further, due to reaction of excited electron, an alkaline metal may be corroded.

Furthermore, a structure of an organic EL element called inverted Light-emitting diodes (iOLED) that has a structure in which an anode and a cathode are inverted is known, which is different from COLED. The iOLED has a structure that can realize both of high durability and flexibility, and does not include an alkaline metal that may cause deterioration, which is a feature. In addition, with use of the iOLED, it is possible to improve quantum efficiency due to phosphorescent. Meanwhile, if the anode and the cathode are inverted as in the iOLED, performance is generally reduced, and therefore, it is needed to appropriately arrange a plurality of kinds of layers between the anode and the cathode in accordance with energy levels.

Figure 2:
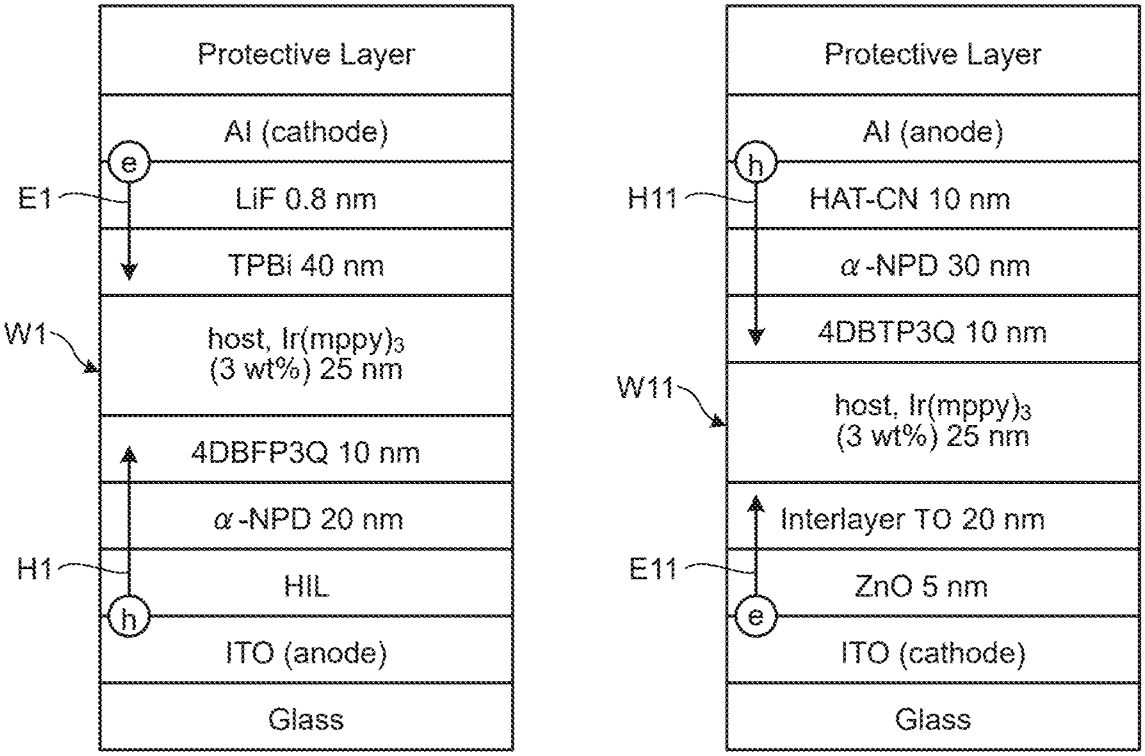
FIG. 2 is a diagram illustrating an example of structures of a COLED and an iOLED.

FIG. 2 is a diagram illustrating an example of structures of the cOLED and the iOLED. A left side in FIG. 2 illustrates an example of the structure of the cOLED, in particular, an example in which aluminum (Al) is used as an anode and indium tin oxide (ITO) is used as a cathode. In the COLED, a hole H1 that is injected from the anode and an electron E1 that is injected from the cathode are coupled with each other in a light emitting layer W1. Furthermore, a right side in FIG. 2 illustrates an example of the structure of the iOLED, in particular, an example in which indium tin oxide is used as an anode and aluminum is used as a cathode. In the iOLED, an electron E11 that is injected from the anode and a hole H11 that is injected from the cathode are coupled with each other in a light emitting layer W11.

Examples of the textile 100 include a textile that has a structure of the iOLED. The configuration of the textile 100 will be described in further detail below. Meanwhile, in the following, explanation will be given based on the assumption that the organic EL element is the iOLED.

The textile 100 has a configuration in which a film foil of the organic EL element is woven in a weft yarn, and a part of a plurality of warp yarns serves as a wiring material. Further, the textile 100 is driven by the part of the warp yarns serving as the wiring material, and the part of the warp yarns serving as the wiring material is controlled by the control apparatus 10. In this manner, drive is controlled by adopting the part of the warp yarns as a control line.

Furthermore, the textile 100 has a configuration in which a part of the warp yarns is connected to a power source for controlling an electrical current. Moreover, the textile 100 controls the electrical current by the part of the warp yarns connected to the power source, and the electrical current is controlled by the control apparatus 10. In this manner, the electrical current is controlled by adopting the part of the warp yarns as a line of the power source.

Furthermore, the textile 100 has a configuration in which the warp yarns and the weft yarns are woven such that the organic EL element is driven in a grid manner like a display. Meanwhile, by using the iOLED as the organic EL element and by weaving the warp yarns and the weft yarns such that the organic EL element is driven in a grid manner, it is possible to realize the textile 100 that is flexible, breathable, and has excellent stability.

Figure 3:
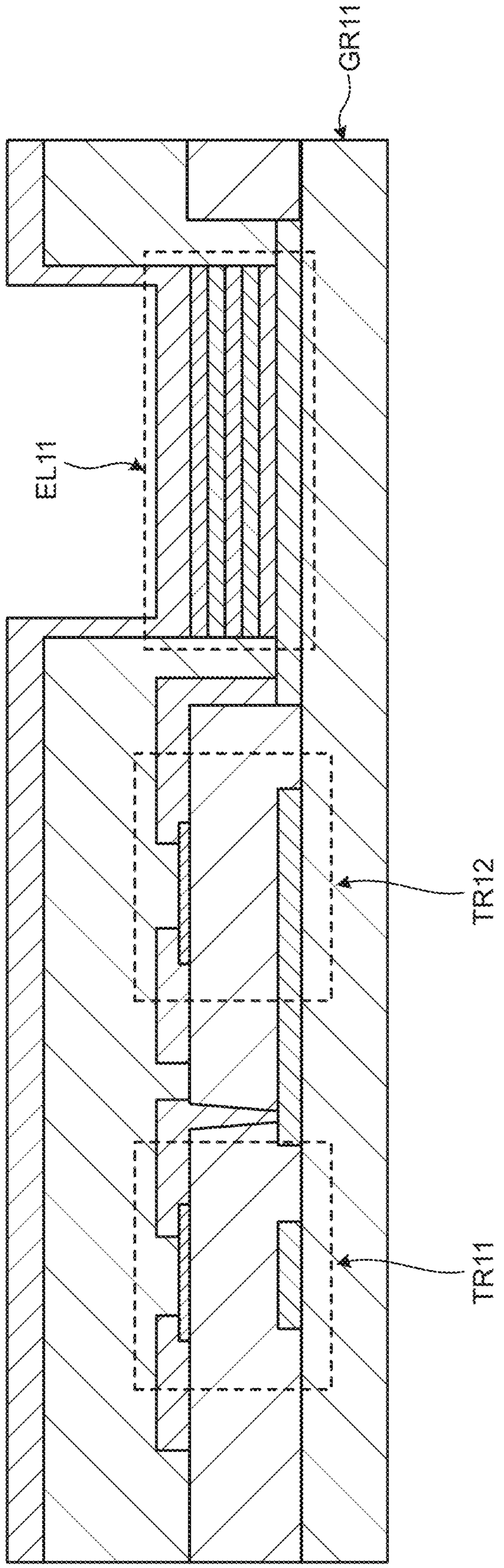
FIG. 3 is a diagram illustrating an example of a configuration of a textile according to one embodiment.

FIG. 3 is a diagram illustrating an example of the configuration of the textile 100. The textile 100 has a configuration in which a selection transistor TR11 for selecting a part of warp yarns that serves as the wiring material, a control transistor TR12 for controlling the electrical current, and an organic EL element EL11 are combined and arranged on a flexible film GR11 that is made of Poly Ethylene Telephthalate (PET) or the like. Meanwhile, the film GR11 is not limited to PET, but may be any film as long as the film GR11 is an insulator. For example, the film GR11 may be an opaque flexible film that is made of polyimide or the like.

Figure 4:
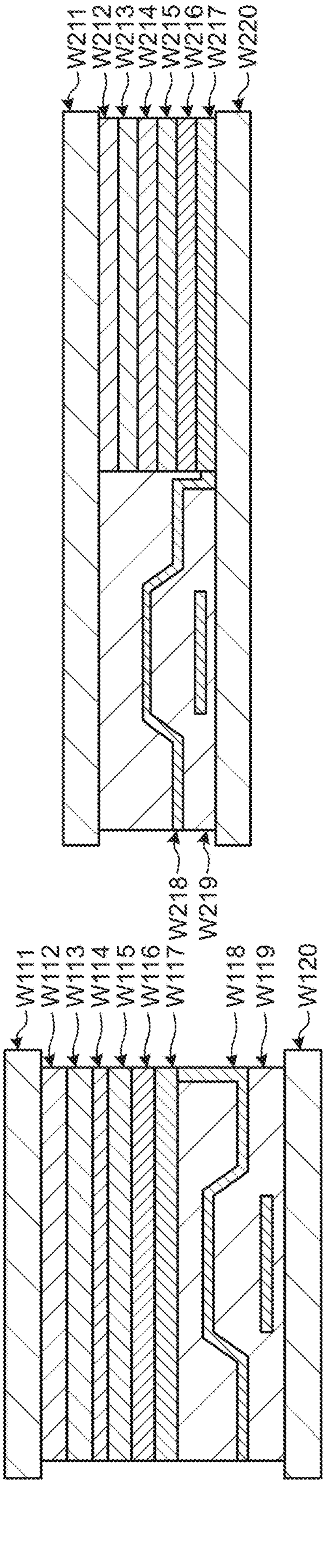
FIG. 4 is a diagram illustrating an example of arrangement of transistors and an organic EL element according to one embodiment.

FIG. 4 is a diagram illustrating an example of arrangement of the transistors and the organic EL element according to one embodiment. As for the arrangement, it may be possible to adopt laminated arrangement in which the two transistors for selection and control and the organic EL element are arranged side by side in a longitudinal direction (left side in FIG. 4) or it may be possible to adopt lateral arrangement in which the two transistors and the organic EL element are arranged side by side in a lateral direction (right side in FIG. 4). Meanwhile, in the arrangement of the two transistors for selection and control and the organic EL element, which of the transistors is arranged on a preceding stage of the organic EL element is not specifically limited.

In FIG. 4, a layer W111 and a layer W211 are protective layers (surface layers), a layer W112 and a layer W212 are electrode layers (anode layers), a layer W113 and a layer W213 are hole transfer layers, a layer W114 and a layer W214 are light emitting layers, a layer W115 and a layer W215 are electron transfer layers, a layer W116 and a layer W216 are electron injection layers, a layer W117 and a layer W217 are electrode layers (cathode layers), a layer W118 and a layer W218 are TFT layers for the control transistor, a layer W119 and a layer W219 are TFT layers for the selection transistor, and a layer W120 and a layer W220 are films.

Here, to drive the organic EL element in a grid manner like a display, it is needed to connect foils of the organic EL element. Further, it is needed to supply power to the two transistors and the anode of the organic EL element. The textile 100 supplies power by conductive contact of the warp. Specifically, the textile 100 connects the foils of the organic EL element by the conductive contact. Meanwhile, the conductive contact is performed by, for example, a metal, low melting solder, an anisotropy conductive film (ACF film).

In general, as a semiconductor design, it is not needed to expose the electrode layer from the protective layer; however, in the textile 100, to allow power supply from the warp by the conductive contact, the electrode layer is exposed from the protective layer that is an insulator. In this manner, the warp is arranged so as to come into contact with an exposed region in which the electrode layer is exposed from the protective layer and a part of the protective layer is removed. Further, because of wire connection from the top surface, the conductive contact will be appropriately referred to as "top contact" below.

Furthermore, the exposed electrode layer is one electrode layer, and, because the organic EL element is the iOLED, the electrode layer at the side of the anode is exposed. Moreover, the one exposed electrode layer includes a driving circuit for transmitting electric power for driving to the light emitting layer and a control circuit for controlling the driving circuit, and the driving circuit and the control circuit are exposed in the exposed region. Meanwhile, voltage reverse to the one exposed electrode layer is continuously applied to the other non-exposed electrode layer.

Figure 5:
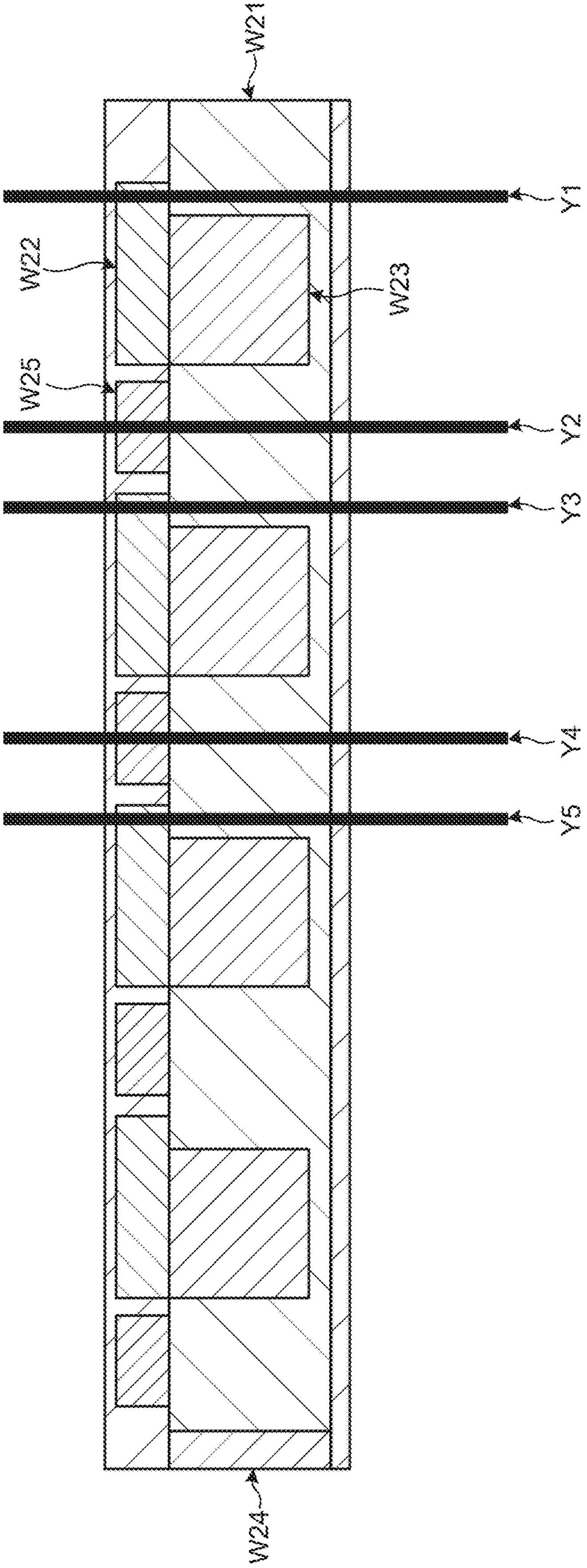
FIG. 5 is a diagram illustrating an example of the configuration of the textile according to the embodiment as viewed from directly above.

FIG. 5 is a diagram illustrating an example of the configuration of the textile 100 (lateral arrangement on the right side in FIG. 4) as viewed from directly above. In FIG. 5, a layer W21 is a protective layer, a layer W22 is an electrode layer (anode layer), a layer W23 is a light emitting layer, a layer W24 is an electrode layer (cathode layer), and a layer W25 is a gate electrode layer. Among the layers as described above, the layer W22 and the layer W23 are layers of the organic EL element, and the layer W25 is a layer of the transistor.

Further, yarns Y1 to Y5 are conductive yarns. For example, in the case of 16 pixels, 32 conductive yarns are arranged so as not to overlap with pixels corresponding to the light-emitting unit. Meanwhile, although not illustrated in the drawings, a large number of non-conductive yarns are arranged parallel to the yarns Y1 to Y5. In this manner, in the warp, the conductive yarns and the non-conductive yarns are arranged parallel to each other. Furthermore, the non-conductive yarns may be arranged so as to alternately pass by an upper side and a lower side of the weft.

In FIG. 5, for example, the yarn Y1 is arranged so as to come into contact with the layer W22 that is exposed from the layer W21, and power is supplied from the yarn Y1 by the top contact. Further, for example, the yarn 2 is arranged so as to come into contact with the layer W25 that is exposed from the layer W21. In FIG. 4, it looks like that the entire region is covered by the protective layer that is an insulator; however, in reality, as illustrated in FIG. 5, only a part of the region is covered and a different part of the region is exposed when viewed from directly above.

In this manner, in the textile 100, wire connection in the longitudinal direction is performed by the top contact. A configuration using the two transistors is common; however, although patterning is generally performed on a plane, the textile 100 has a configuration in which wire connection in the longitudinal direction is performed by the top contact and the two transistors are used one-dimensionally.

Figure 6:
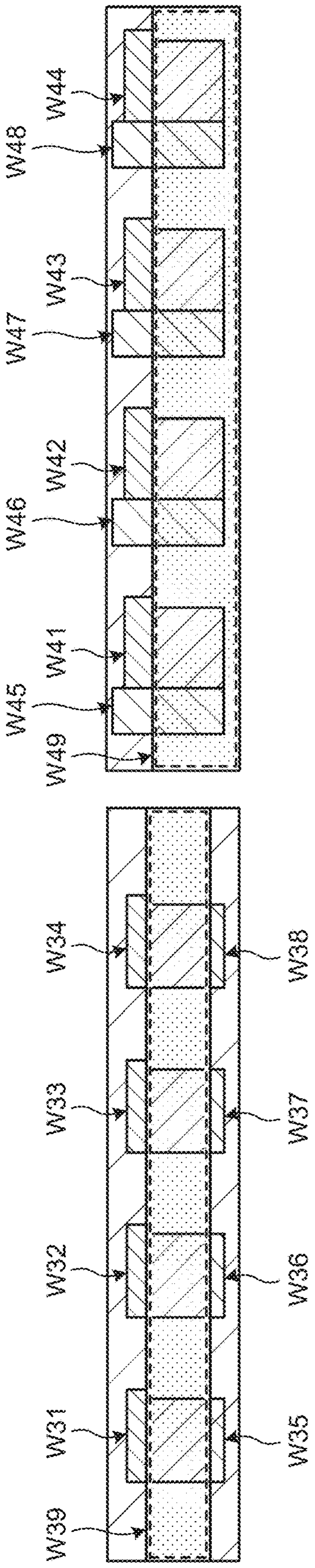
FIG. 6 is a diagram illustrating an example of the configuration of the textile according to the embodiment as viewed from directly above.

FIG. 6 is a diagram illustrating an example of the configuration of the textile 100. A left side in FIG. 6 is a diagram illustrating the configuration of the textile 100 that is arranged in the laminated arrangement as illustrated on the left side in FIG. 4, and a right side in FIG. 6 is a diagram illustrating the configuration of the textile 100 that is arranged in the lateral arrangement as illustrated on the right side in FIG. 4, when viewed from directly above similarly to FIG. 5.

In FIG. 6, layers W31 to W34 and layers W41 to W44 are electrode layers (anode layers), layers W35 to W38 and layers W45 to W48 are gate electrode layers, and a layer W39 and a layer W49 (shaded portions) are protective layers. In this manner, the exposed regions are different between the laminated arrangement and the lateral arrangement; however, in each of the arrangement, the warp is arranged so as to come into contact with the exposed region (the anode layer and the gate electrode layer).

Meanwhile, in the embodiment as described above, it is preferable to use an organic material for the transistors because it is difficult to bend the transistors if the transistors are not soft; however, even if an inorganic material is used, it is possible to bend the transistors by thinning the transistors, and therefore, a material of the transistors is not specifically limited. Furthermore, it may be possible to form the transistors by silicone that is a hard material, and combine the transistors with a bendable electrode layer. In this manner, if the organic EL element is soft, the transistors can be hard.

Meanwhile, in the embodiment as described above, the top contact may be performed in any contact method. For example, the top contact may be performed by a method of winding a conductive yarn around a conductive substrate, a method of caulking by a mechanical member, a method of bonding by using solder, conductive grease, or the like, a method of sandwiching by a magnet or the like, a method of crimping by using an ACF film, or the like. Meanwhile, the contact methods as described above are mere examples, and the contact method is not specifically limited.

2. Configuration of Information Processing System

Figure 7:
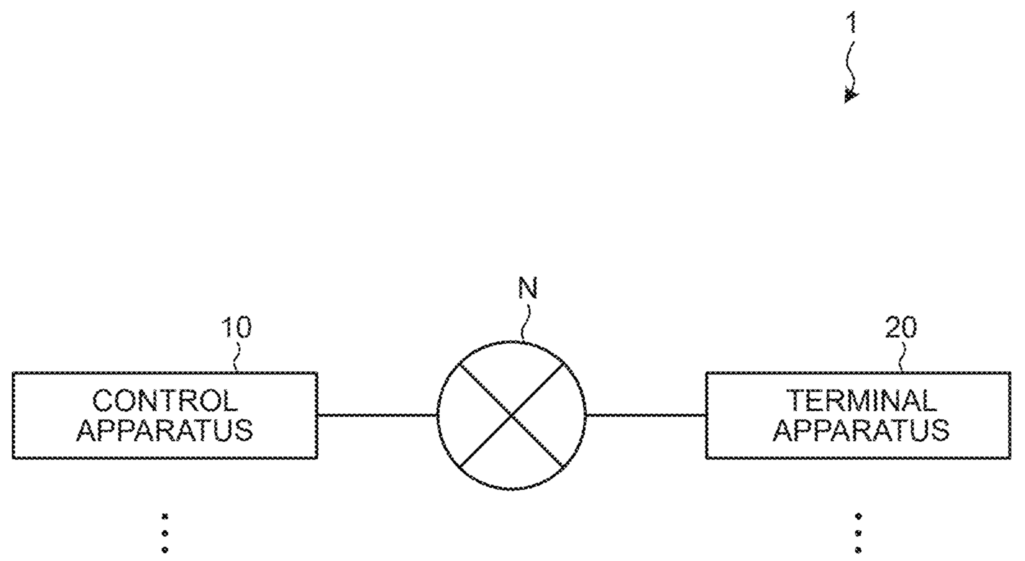
FIG. 7 is a diagram illustrating a configuration example of an information processing system 1 according to one embodiment.

An information processing system 1 illustrated in FIG. 7 will be described below. As illustrated in FIG. 7, the information processing system 1 includes the control apparatus 10 and the terminal apparatus 20. The control apparatus 10 and the terminal apparatus 20 are communicably connected to each other in a wired or wireless manner via a predetermined communication network (network N). FIG. 7 is a diagram illustrating a configuration example of the information processing system 1 according to one embodiment. Meanwhile, the information processing system 1 illustrated in FIG. 7 may include the plurality of control apparatuses 10 or the plurality of terminal apparatuses 20.

the control apparatus 10 is a control apparatus of the textile 100 that is a smart textile. The control apparatus 10 performs processes based on information that is transmitted from the terminal apparatus 20 or the like via the network N. For example, the control apparatus 10 performs a process for changing a design of the textile 100. Specifically, the control apparatus 10 performs a process for selectively supply power by the top contact.

The terminal apparatus 20 is an information processing apparatus that is used by a user. The terminal apparatus 20 may be any apparatus as long as the apparatus is able to perform processes of one embodiment. Further, the terminal apparatus 20 may be a smartphone, a tablet terminal, a notebook personal computer (PC), a desktop PC, a mobile phone, a personal digital assistant (PDA), a microcontroller, or the like. The terminal apparatus 20 transmits control information to the control apparatus 10 in accordance with setting that is input by the user, for example.

Meanwhile, FIG. 7 illustrates a case in which the control apparatus 10 and the terminal apparatus 20 are separate apparatuses, but the control apparatus 10 and the terminal apparatus 20 may be integrated with each other.

3. Use Modes

Actual Use Modes will be Described Below.

For example, when design information (for example, image information) to be subjected to a design change or time information (for example, timing information on a design change) are set on an application that is installed in the terminal apparatus 20, the information is transmitted to the control apparatus 10 via the network N, and a design of the textile 100 may be changed based on the set design information or the set time information. In this case, for example, the information may be converted to arbitrary RGB output information and displayed as a display. In this manner, it may be possible to provide an interactive design change system that is synchronized with the application.

Furthermore, for example, it may be possible to provide a color-changing (thermosensitive) textile by combining a heater with the textile 100. In this case, a heat source of the heater is controlled by, for example, the control apparatus 10. In this manner, by modifying the textile 100 to the color-changing textile, it may be possible to provide a design change system that changes a design in response to heat of the heater.

4. Effects

As described above, the textile 100 according to the embodiment includes warp and weft that are woven, where the weft is covered by a light emitting layer, electrode layers that sandwich the light emitting layer, and a protective layer that sandwiches the electrode layers, the weft includes an exposed region in which a part of the protective layer is removed, and the warp is conductive warp that is arranged so as to come into contact with the exposed region.

With this configuration, it is possible to realize the textile 100 that has a display function, that is supple, breathable, and that has excellent stability. Furthermore, it is possible to realize the textile 100 that is supple, breathable, and has excellent stability, and therefore, for example, the textile may be effectively implemented as a casing of a smartphone, wall paper, clothes, a curtain, a light shade, or the like. For example, when the textile is implemented as a casing of a smartphone, a design is changed to the casing of the smartphone. For example, it may be possible to display a design that is not displayed on the casing of the smartphone, it may be possible not to display a design that is displayed on the casing of the smartphone, or it may be possible to display a design that is displayed on the casing of the smartphone in vivid colors.

Furthermore, the weft is covered by the protective layer that is an insulator.

With this configuration, it is possible to provide the textile 100 with excellent stability.

Moreover, one of the electrode layers is exposed in the exposed region.

With this configuration, it is possible to provide the textile 100 that is able to supply power by the top contact.

Furthermore, the one of the electrode layers includes a driving circuit for transmitting driving electric power to the light emitting layer and a control circuit for controlling the driving circuit, and the driving circuit and the control circuit are exposed in the exposed region.

With this configuration, it is possible to provide the textile 100 that is able to supply power by the top contact.

Moreover, the electrode layer at a side of an anode is exposed as the one of the electrode layers.

With this configuration, it is possible to realize the textile 100 that is supple, breathable, and has excellent stability.

Furthermore, voltage reverse to the one exposed electrode layers is continuously applied to another unexposed electrode layer.

With this configuration, it is possible to realize the textile 100 that is supple, breathable, and has excellent stability.

Moreover, conductive yarns and non-conductive yarns are arranged side by side in the warp, and non-conductive yarns are woven so as to alternately pass above and below the weft.

With this configuration, it is possible to realize the textile 100 that is supple, breathable, and has excellent stability.

5. Others

Of the processes described in the embodiments, all or part of a process described as being performed automatically may also be performed manually. Alternatively, all or part of a process described as being performed manually may also be performed automatically by known methods. In addition, the processing procedures, control procedures, specific names, and information including various kinds of data and parameters illustrated in the above-described document and drawings may be arbitrarily changed unless otherwise specified. For example, the various kinds of information illustrated in each of the drawings are not limited to the information illustrated in the drawings.

Furthermore, the components illustrated in the drawings are functionally conceptual and do not necessarily have to be physically configured in the manner illustrated in the drawings. In other words, specific forms of distribution and integration of the apparatuses are not limited to those illustrated in the drawings, and all or part of the apparatuses may be functionally or physically distributed or integrated in arbitrary units depending on various loads or use conditions.

Moreover, the embodiments as described above may be combined appropriately as long as processes do not conflict with each other.

While the embodiments of the present invention have been described above, the embodiments are examples, and the present invention may be embodied in various forms with various changes or modifications based on knowledge of a person skilled in the art, in addition to the embodiments described in the present disclosure of the invention.

REFERENCE SIGNS LIST

1 information processing system

10 control apparatus

20 terminal apparatus

100 textile

N network

The invention claimed is:

1. A textile including:

warp; and weft, wherein the warp and the weft are woven, the weft is covered by a light emitting layer, electrode layers that sandwich the light emitting layer, and a protective layer that sandwiches the electrode layers, the weft includes an exposed region in which a part of the protective layer is removed, and the warp is conductive warp that is arranged so as to come into contact with the exposed region.

2. The textile according to claim 1, wherein the weft is covered by the protective layer that is an insulator.

3. The textile according to claim 1, wherein one of the electrode layers is exposed in the exposed region.

4. The textile according to claim 3, wherein the one of the electrode layers includes a driving circuit for transmitting driving electric power to the light emitting layer and a control circuit for controlling the driving circuit, and the driving circuit and the control circuit are exposed in the exposed region.

5. The textile according to claim 3, wherein the electrode layer at a side of an anode is exposed as the one of the electrode layers.

6. The textile according to claim 3, wherein voltage reverse to the one exposed electrode layers is continuously applied to another unexposed electrode layer.

7. The textile according to claim 1, wherein conductive yarns and non-conductive yarns are arranged side by side in the warp, and non-conductive yarns are woven so as to alternately pass above and below the weft.

8. A textile-type device including:

a textile that includes warp and weft that are woven, wherein the weft is covered by a light emitting layer, electrode layers that sandwich the light emitting layer, and a protective layer that sandwiches the electrode layers, the weft includes an exposed region in which a part of the protective layer is removed, and the warp is conductive warp that is arranged so as to come into contact with the exposed region.

* * * * *